(12) United States Patent
Jabara

(10) Patent No.: US 10,432,137 B2
(45) Date of Patent: Oct. 1, 2019

(54) SOLAR ENERGY COLLECTOR AND METHOD OF OPERATION

(71) Applicant: Cameron Ernest Jabara, Newport Beach, CA (US)

(72) Inventor: Cameron Ernest Jabara, Newport Beach, CA (US)

(*) Notice: Subject to any disclaimer, the term of this patent is extended or adjusted under 35 U.S.C. 154(b) by 13 days.

(21) Appl. No.: 15/714,994

(22) Filed: Sep. 25, 2017

(65) Prior Publication Data

US 2019/0097575 A1   Mar. 28, 2019

(51) Int. Cl.
| | | |
|---|---|---|
| *H01L 31/048* | (2014.01) | |
| *H02S 40/22* | (2014.01) | |
| *H02S 40/40* | (2014.01) | |
| *H02S 30/10* | (2014.01) | |
| *H02S 20/00* | (2014.01) | |

(52) U.S. Cl.
CPC .......... *H02S 40/22* (2014.12); *H01L 31/048* (2013.01); *H02S 20/00* (2013.01); *H02S 30/10* (2014.12); *H02S 40/40* (2014.12)

(58) Field of Classification Search
CPC .......... H02S 40/22; H02S 40/40; H02S 20/00; H02S 30/10; H01L 31/048
See application file for complete search history.

(56) References Cited

U.S. PATENT DOCUMENTS

| | | | | |
|---|---|---|---|---|
| 2,904,612 A | * | 9/1959 | Regnier | ............... H01L 31/0547 136/246 |
| 3,427,200 A | * | 2/1969 | Ernest | ..................... H01L 25/03 136/246 |
| 4,210,463 A | * | 7/1980 | Escher | ................... F24S 30/425 136/246 |
| 4,334,120 A | * | 6/1982 | Yamano | ............ H01L 31/02013 136/248 |
| 6,843,573 B2 | | 1/2005 | Rabinowitz | |
| 6,895,145 B2 | * | 5/2005 | Ho | ....................... G02B 6/4298 385/35 |
| 6,897,085 B2 | | 5/2005 | Hammerbacher | |
| 6,957,894 B2 | | 10/2005 | Rabinowitz | |
| 6,964,486 B2 | | 11/2005 | Rabinowitz | |
| 6,988,809 B2 | | 1/2006 | Rabinowitz | |
| 7,077,361 B1 | | 7/2006 | Rabinowitz | |
| 7,133,183 B2 | | 11/2006 | Rabinowitz | |
| 7,160,522 B2 | | 1/2007 | Minano Dominguez | |
| 7,187,490 B2 | | 3/2007 | Rabinowitz | |

(Continued)

OTHER PUBLICATIONS

Duerr, Fabian, et al., "Tailored Free-Form Optics with Movement to Integrate Tracking in Concentrating Photovoltaics," Optical Society of America, May 6, 2013, 11 pages, vol. 21, No. 3, Vrije Universiteit Brussels, Brussels, Belgium.

*Primary Examiner* — Golam Mowla
(74) *Attorney, Agent, or Firm* — Davis Wright Tremaine LLP; Michael J. Donohue

(57) ABSTRACT

A solar collection system is mounted inside a containment vessel. The upper portion of the containment vessel is optically transparent and includes one or more lens elements to help direct light to an upward facing solar panel. The lower portion of the containment vessel comprises a mirrored surface to help reflect light upward to a downward facing solar panel. The shape of the upper and lower portions of the containment vessel may be altered based on the selected implementation. A variety of lens configurations may also be used.

11 Claims, 8 Drawing Sheets

(56) References Cited

U.S. PATENT DOCUMENTS

| | | |
|---|---|---|
| 7,247,790 B2 | 7/2007 | Rabinowitz |
| 7,486,431 B2 | 3/2009 | Rabinowitz |
| 7,558,452 B2 | 7/2009 | Ho |
| 7,568,479 B2 | 8/2009 | Rabinowitz |
| 7,597,826 B1 | 10/2009 | Rabinowitz |
| 7,804,637 B2 | 9/2010 | Rabinowitz |
| 8,053,662 B2 | 11/2011 | Khazeni et al. |
| 8,101,855 B2 | 1/2012 | Benitez et al. |
| 8,350,145 B2 * | 1/2013 | Angel ............... C03B 23/0256 136/246 |
| 8,419,232 B2 | 4/2013 | Minano et al. |
| 8,592,673 B2 | 11/2013 | Benitez et al. |
| 8,631,787 B2 | 1/2014 | Benitez et al. |
| 2006/0231133 A1 * | 10/2006 | Fork ................. H01L 31/02008 136/246 |
| 2007/0251569 A1 * | 11/2007 | Shan ......................... F24J 2/08 136/246 |
| 2008/0170312 A1 | 7/2008 | Rabinowitz |
| 2009/0126795 A1 * | 5/2009 | Williams ............. H01L 31/052 136/259 |
| 2009/0188545 A1 | 7/2009 | Rabinowitz |
| 2009/0314347 A1 * | 12/2009 | Kleinwaechter ....... A01G 9/243 136/259 |
| 2010/0108121 A1 | 5/2010 | Liu |
| 2010/0123954 A1 | 5/2010 | Benitez et al. |
| 2010/0126556 A1 | 5/2010 | Benitez et al. |
| 2010/0326521 A1 | 12/2010 | Rabinowitz |
| 2010/0329619 A1 | 12/2010 | Moore et al. |
| 2011/0120539 A1 | 5/2011 | Minano et al. |
| 2011/0217013 A1 | 9/2011 | Moore et al. |
| 2011/0226308 A1 * | 9/2011 | Pang ....................... H02S 20/00 136/246 |
| 2012/0129292 A1 * | 5/2012 | Safir ................... B32B 37/1018 438/64 |
| 2013/0028565 A1 | 1/2013 | Moore et al. |
| 2013/0146121 A1 * | 6/2013 | Caimi ............. H01L 31/02327 136/246 |
| 2014/0174503 A1 | 6/2014 | Broessel et al. |
| 2017/0200848 A1 | 7/2017 | Benitez et al. |

* cited by examiner

SOLAR ENERGY COLLECTOR AND METHOD OF OPERATION

BACKGROUND OF THE INVENTION

Field of the Invention

The present disclosure relates generally to solar collectors and, more specifically, to a solar cell array contained within a transparent sphere to increase solar radiation directed to solar cells contained within the transparent sphere.

Description of the Related Art

A photovoltaic cell, often referred to as a "solar cell," is an electrical device typically manufactured with semiconductor materials to convert the energy of light directly into electricity. An array of solar cells is typically referred to as a solar panel. The use of solar panels to generate electricity has been known for decades. Satellites and other space craft typically deploy solar panels to generate electricity for the onboard electronics.

The price of solar cells (measured in dollars per watt) decreased dramatically in the 1980s. New manufacturing techniques and increased research has reduced the cost for solar cells and made them an attractive alternative to conventional power stations for the generations of electricity. Roof-mounted solar panels are frequently seen on the roof of a house or other buildings. The flat solar panels are often mounted at an angle to provide more direct impact of solar radiation on the solar cells. However, the typical home installation of solar panels entails fixedly mounting the solar panels to the roof.

Though skilled in the art will appreciate that the fixed orientation of solar panels is not efficient due to the normal trajectory of the sun. As the sun rises and traverses across the daytime (due to the rotation of the earth), the solar radiation strikes the solar panels at varying angles throughout the day. In addition, seasonal fluctuations also alter the solar radiation pattern for a fixed rooftop solar panel array.

Although tracking mechanisms are known to track the sun during the day, and over the change of seasons, this increases the level of complexity of a solar array and requires power for proper operation thus decreasing the potential electrical output of a solar system. In addition, the cost of tracking motors and swiveled mounts for solar panels add to the cost and complexity of deployment. Therefore, it can be appreciated that there is a significant need for an alternative solar panel arrangement that increases the amount of solar radiation directed to the solar panels without the cost and complexity of a tracking system. The present disclosure is directed to a solar energy collector and method of operation that addresses these issues. This, and other advantages, will be apparent from the following detailed description and accompanying figures.

BRIEF DESCRIPTION OF THE SEVERAL VIEWS OF THE DRAWING(S)

DETAILED DESCRIPTION OF THE INVENTION

Figure 1:
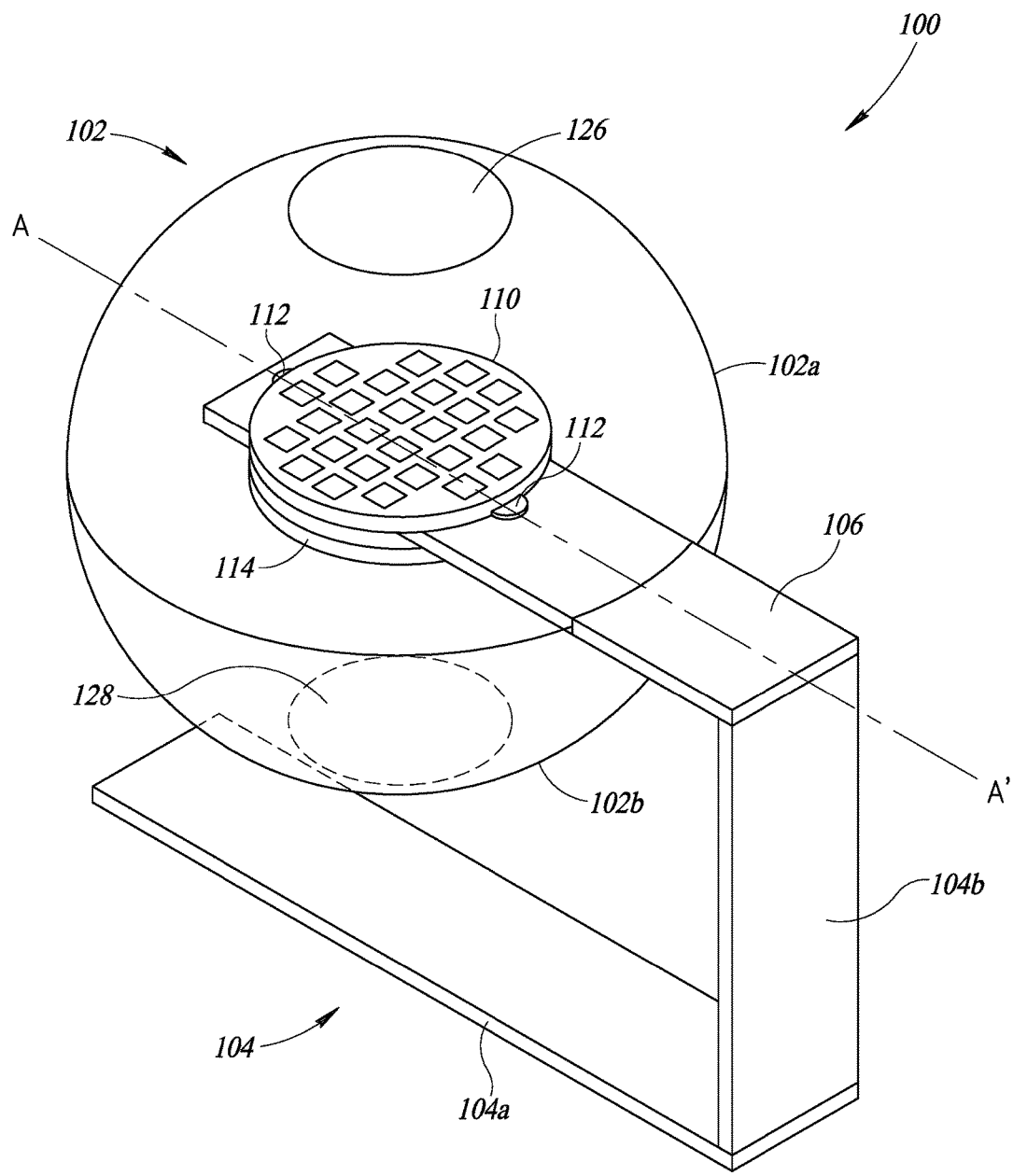
FIG. 1 is a perspective view of a solar energy collector and mounting bracket.

FIG. 1 is a perspective view of a solar energy collector system 100 comprising a containment vessel 102 and a support frame 104. The containment vessel 102 comprises an upper portion 102a and a lower portion 102b. As will be described in greater detail below, the upper and lower portions 102a-102b of the containment vessel 102 are treated differently to accommodate other components in the system 100.

In the exemplary embodiment illustrated in FIG. 1, the support frame 104 comprises a base portion 104a, and side support 104b. Although illustrated as separate pieces, the support frame 104 may be formed from a single piece of material, such as metal, by performing a bending operation to produce the base portion 104a and the side support 104b. The support frame 104 may be manufactured from other materials, such as wood, plastic, or the like. The system 100 is not limited by the specific material used to construct the support frame 104. The specific implementation of the support frame 104 can be readily varied, as design choices dictate, by one of ordinary skill in the art.

The system 100 also includes a component support frame 106, which is mounted at a first end to the side support 104b. As illustrated in FIG. 1, the component support frame 106 is attached to the side support 104b outside the containment vessel 102 and extends into the interior portion of the containment vessel.

Within the interior of the containment vessel 102, an upper solar panel 110 is mechanically attached to an upper surface of the component support frame 106. The upper solar panel is oriented so that the active surface (i.e., the light-sensitive portion) is facing toward the upper portion 102a of the containment vessel 102. In the embodiment illustrated in FIG. 1, the upper solar panel 110 has a generally circular shape. While the circular shape of the upper solar panel 110 matches the generally circular cross sectional shape of the containment vessel 102, those skilled in the art will appreciate that the upper solar panel 110 can be provided in a number of different shapes and sizes. The upper solar panel 110 illustrated in FIG. 1 includes mounting flanges 112 to attach the upper solar panel to the component support frame 106. Again, those skilled in the art will appreciate that commercially available solar panels may have a variety of different attachment elements. The system 100 is not limited by the flanges 112 used to affix the upper solar panel 110 to the component support frame 106.

In an exemplary embodiment, the component support frame 106 may be constructed using a heat conductive material, such as aluminum or other metal. In this embodiment, the component support frame 106 also serves as a heat sink to conduct heat away from the solar panels 110-112. As those skilled in the art can appreciate, the heat build up within the containment vessel 102 can be significant given the transparent materials used to construct the upper portion 102a of the containment vessel. In addition, as will be described in greater detail below, the upper portion 102a of the containment vessel 102 contains elements that function as a lens to focus incoming sunlight onto the upper solar panel 110. Such operation also serves to increase the heat on the surface of the upper solar panel 110. The use of the component support frame 106 as a heatsink can reduce heat build up within the containment vessel 102.

In an alternative embodiment, the component support frame 106 may be a narrow support frame approximately the width of mounting flanges 112. This arrangement reduces the amount incoming solar radiation that may be blocked by the physical structure used to implement the component support frame 106. In yet another alternative embodiment, the component support frame 106 may be constructed of optically transparent material, such as plastic, acrylic (e.g., polymethyl methacrylate), to further increase the amount of solar radiation reaching the bottom portion 102b of the containment vessel 102. Although such materials may have low thermal conductivity, other cooling techniques, described below, can be used to reduce heat build up in the containment vessel 102.

Also illustrated in FIG. 1 is a lower solar panel 114. The lower solar panel is mounted to a lower surface of the component support frame 106 and has the active surface (i.e., the light-sensitive portion) oriented toward the lower portion 102b of the containment vessel 102. Although not illustrated in FIG. 1, the lower solar panel may also include mounting flanges 112, similar to the flanges on the upper solar panel 110 to facilitate mounting of the lower solar panel to the component support frame 106. Those skilled in the art will appreciate that other attachment techniques may be used to mount the lower solar panel 114 to the component support frame 106. Furthermore, those skilled in the art will appreciate that the shape of the lower solar panel 114 need not be identical to that of the upper solar panel 110. Although FIG. 1 illustrates a generally circular lower solar panel 114, the specific size and shape of the lower solar panel 114 may be varied.

FIG. 1 also illustrates an optional upper aperture 126 and an optional lower aperture 128. The upper aperture 126 allows heat to escape from the interior of the containment vessel 102. Although illustrated as a single vent in FIG. 1, those skilled in the art will appreciate that the upper aperture 126 can be implemented as a series of small holes in the upper portion 102a of the containment vessel 102. Furthermore, the upper and lower apertures 126-128 may be implemented in other shapes besides the circular shapes illustrated in FIG. 1.

The lower aperture 128 can serve multiple functions. In one aspect, the lower aperture 128 permits moisture to escape from the interior of the containment vessel 102. Operating in conjunction with the upper aperture 126, fresh air is drawn into the interior of the containment vessel 102 through the lower aperture 128 as hot air exits the containment vessel through the upper aperture. This process can reduce heat build up inside the containment vessel 102.

Figure 2:
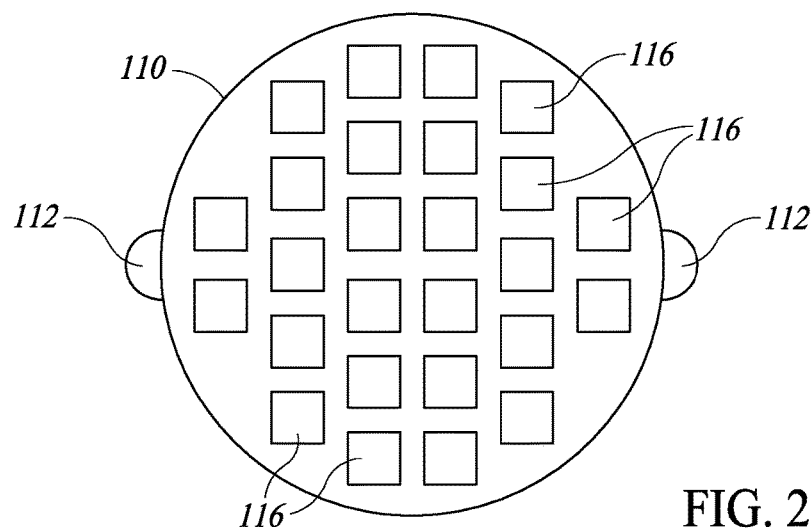
FIG. 2 is a top plan view of one of the solar panels used within the solar energy collector of FIG. 1.

FIG. 2 illustrates a top-plan view of the upper solar panel 110 and illustrates the flanges 112. Those skilled in the art will appreciate that a solar panel, such as the upper solar panel 110, comprises an array of solar cells 116 that form the active surface of the solar panel. The individual solar cells 116 contain the light-sensitive portion that uses the well-known photovoltaic effect to generate electricity in the presence of sunlight. In one embodiment, the lower solar panel 114 may have a similar size and shape as the upper solar panel 110 illustrated in FIG. 2.

Figure 3:
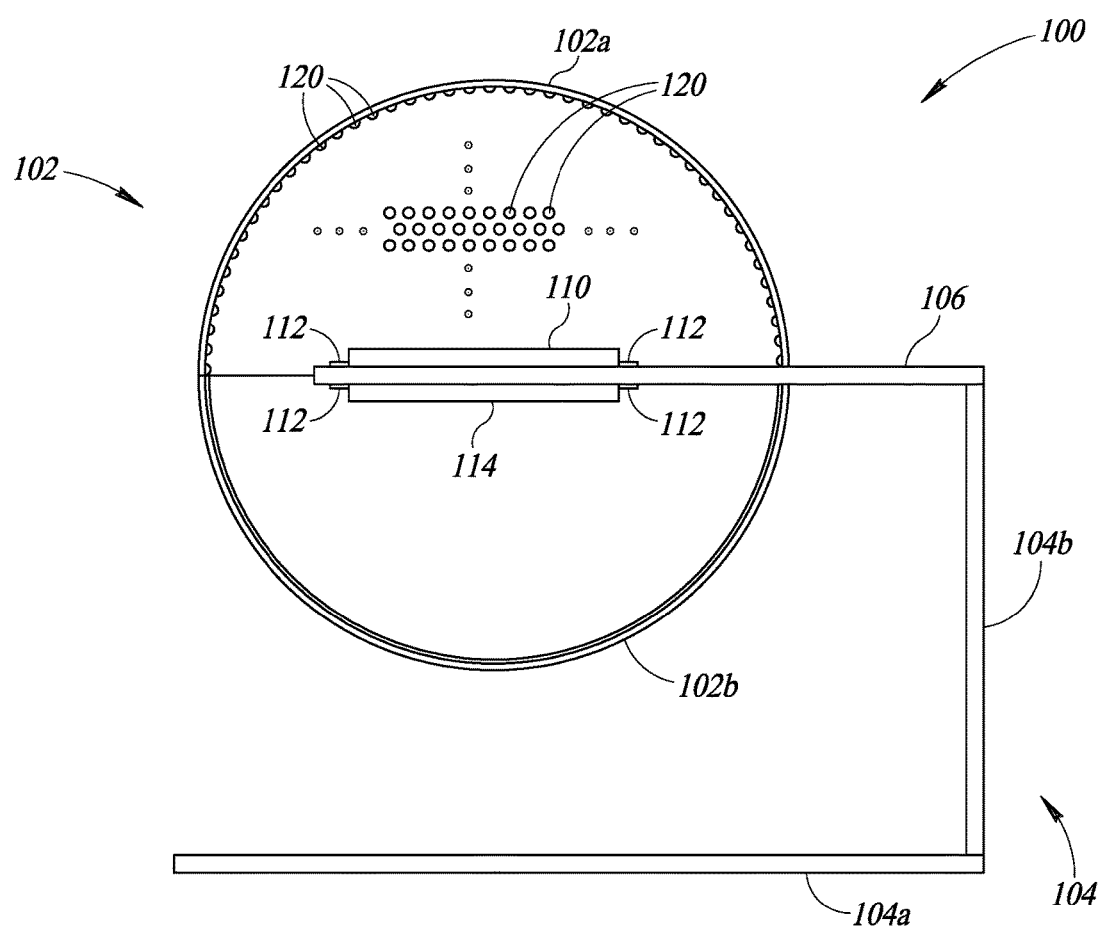
FIG. 3 is a front elevational view along the line A-A' in FIG. 1.

FIG. 3 is a front elevational cutaway view taken along the line A-A' in FIG. 1. As seen in FIG. 3, the interior of the upper portion 102a is treated differently than the interior of the lower portion 102b of the containment vessel 102. The interior of the upper portion 102a of the containment vessel includes an array of surface features 120 that function as a lens to help direct off-axis light to the upper solar panel 110. In one embodiment, the surface features 120 may be implemented in the form of a lenticular lens array. In another embodiment, the individual surface features 120 may be spaced further apart than is typically used in a lenticular array. In one embodiment, the surface features 120 may be hemispherical in shape and spaced apart from one another to create an array of surface features. In yet another alternative, the upper portion 102a may be implemented as a Fresnel lens.

In operation, solar radiation arriving at the upper portion 102a of the containment vessel 102 is directed through the array of surface features 120 to increase the amount of solar radiation striking the active surface of the upper solar panel 110.

While the interior of the upper portion 102a of the containment vessel 102 contains the surface features 120, the interior of the lower portion 102b of the containment vessel 102 is coated with a mirror or other highly reflective surface 122 to reflect solar radiation from the lower portion 102b to the lower solar panel 114. Thus, the system 100 incorporates upper and lower solar panels 110 and 114. Those skilled in the art will appreciate that a variety of alternative embodiments are possible.

Figure 4:
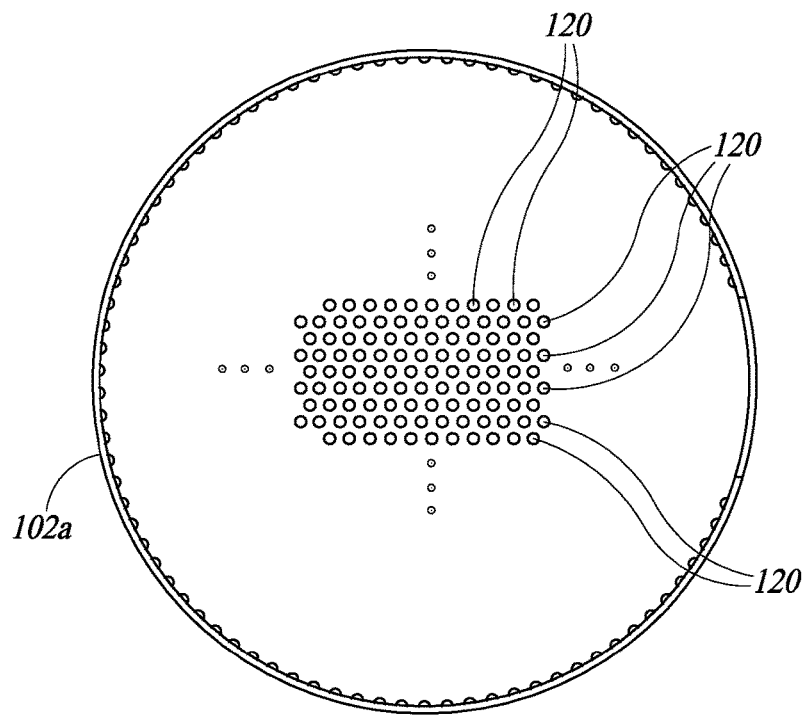
FIG. 4 is an interior view of the upper portion of the solar energy containment vessel.
Figure 5:
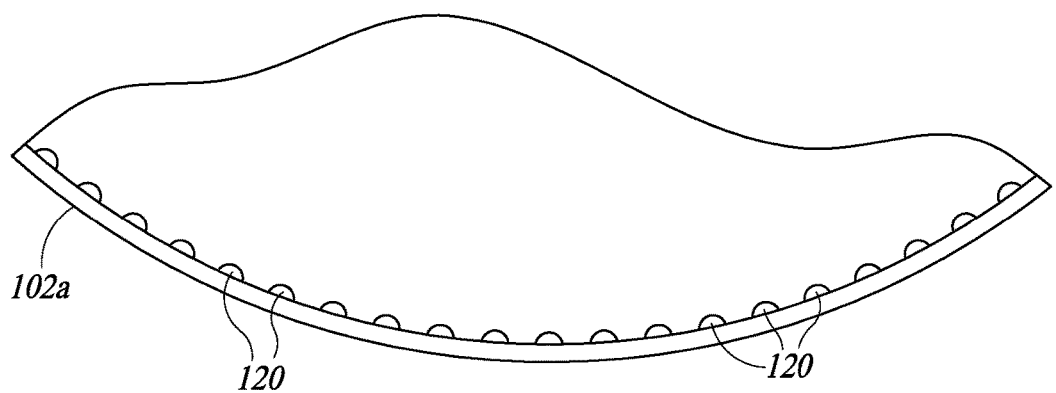
FIG. 5 is an enlarged fragmented view of the interior of the upper portion of the containment vessel illustrating an array of protrusions on the interior surface.

FIG. 4 is a view of the interior of the upper portion 102a of the containment vessel 102. In this embodiment, the surface features 120 may comprise a plurality of hemispherical protrusions on the interior surface of the upper portion 102a. FIG. 5 illustrates an enlarged, fragmented view of the interior of the upper portion 102a showing the hemispherical shaped surface features 120. In this embodiment, each of the hemispherical shaped surface features 120 functions as an independent lens to direct light to the upper solar panel 110.

In an alternative embodiment, the hemispherical shaped surface features 120 may be disposed on the outer surface of the upper portion 102a. Although not illustrated herein, each of the hemispherical shaped surface features 120 on the outer surface of the upper portion 102a functions as an independent lens to direct light to the upper solar panel 110.

Figure 6:
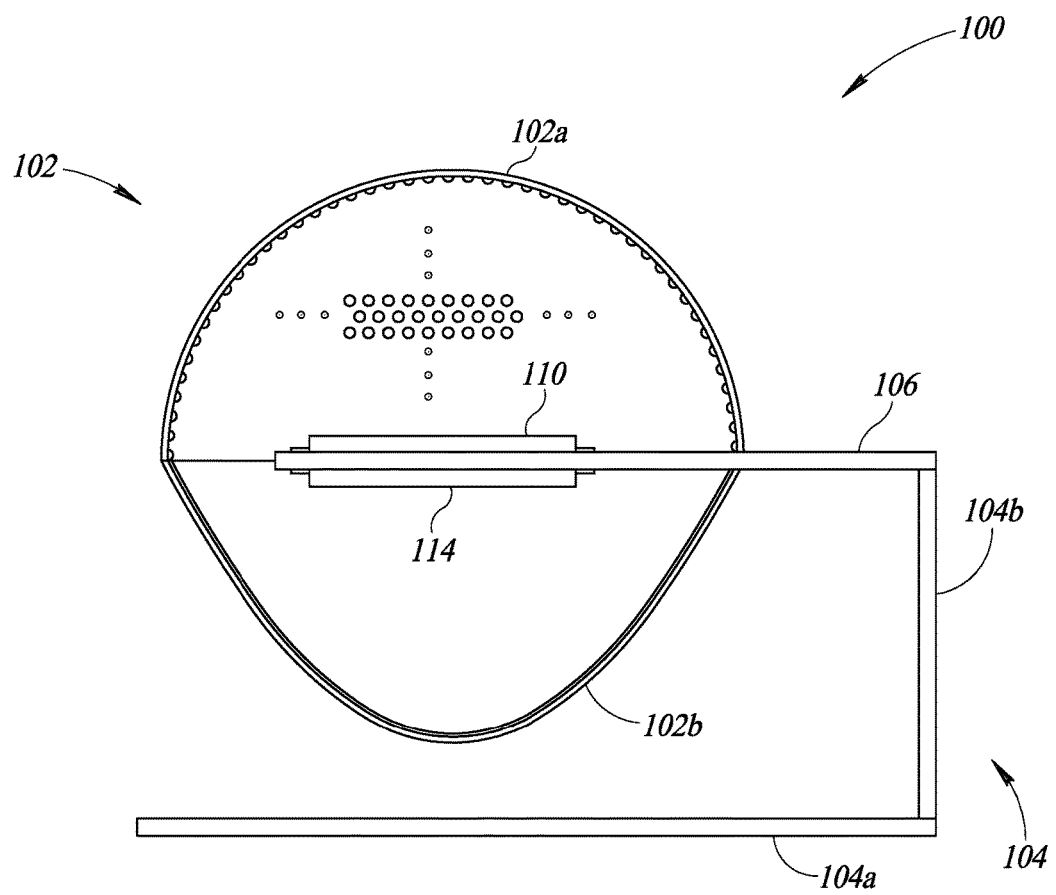
FIG. 6 is a front elevational cutaway view similar to FIG. 3, but with a different shape of a lower portion of the containment vessel.
Figure 7:
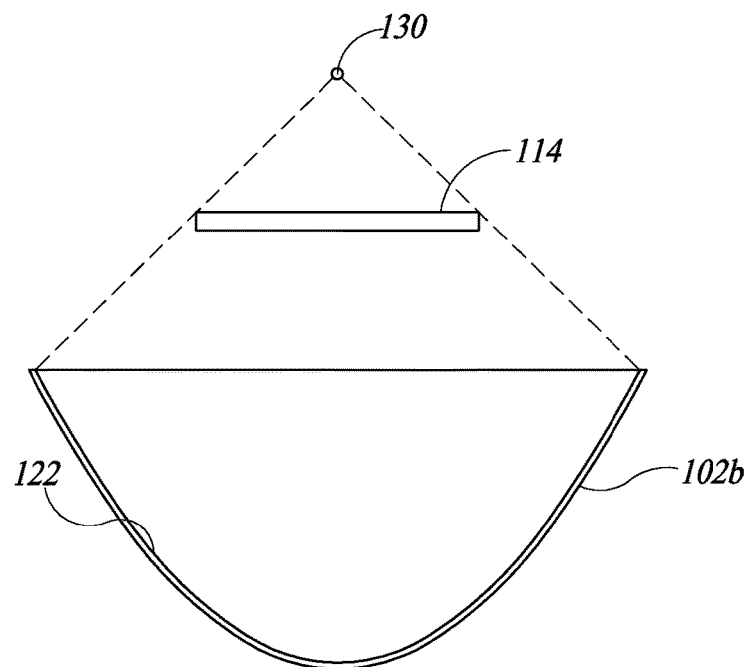
FIG. 7 is a front elevational cutaway view of the embodiment of FIG. 6 with certain components removed to better illustrate the alternative shape of the lower portion of the containment vessel.

The containment vessel 102 may also be provided in different shapes and configurations. For example, FIGS. 1 and 3 illustrate the containment vessel 102 in the form of a sphere. In this embodiment, the upper portion 102a and the lower portion 102b are both substantially hemispherical in shape. In the embodiment of FIG. 6, the upper portion 102a is hemispherical, but the lower portion 102b of the containment vessel 102 is parabolic in shape. The mirrored surface on the interior of the lower portion 102b focuses reflected light on a focal point 130, illustrated in FIG. 7. As those skilled in the art will appreciate, this embodiment of the lower portion 102b functions to reflect incoming light to the focal point 130. The lower solar panel 114 is positioned in between the lower portion 102b and the focal point 130, such that the lower solar panel captures all or most of the light reflecting off of the mirror 122 of the lower portion 102b. It should be noted that other elements, such as the support frame 104 and component support frame 106 have been omitted from FIG. 7 for the sake of clarity. Similarly, the upper portion 102a of the containment vessel 102 and the upper solar panel 110 have likewise been omitted from FIG. 7 to better illustrate the operation of the parabolic shaped lower portion 102b.

Figure 8:
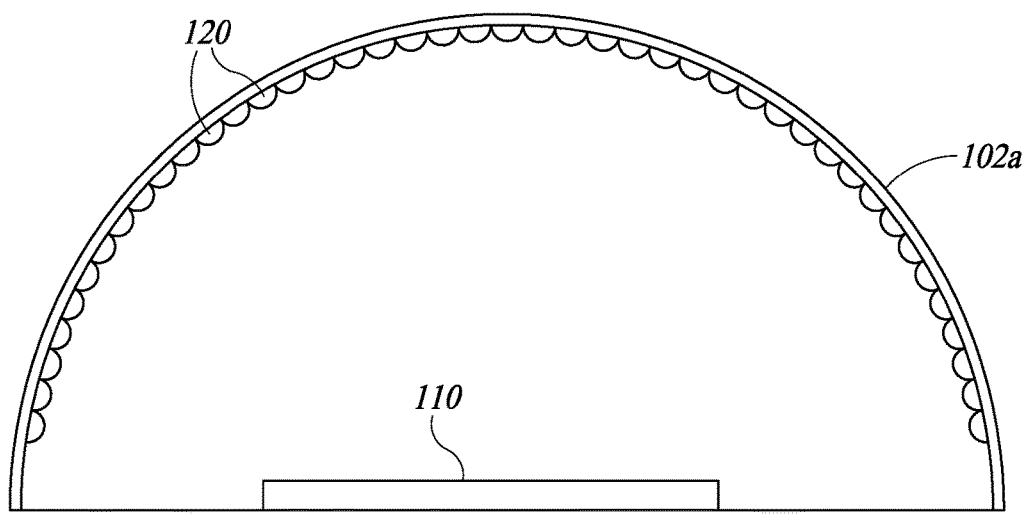
FIG. 8 illustrates a front elevational cutaway view of an upper portion of the containment vessel with a different lens implementation.

FIGS. 8-12 illustrate variations for the implementation of the upper portion 102a of the containment vessel 102. Again, for the sake of clarity, components, such as the support frame 104, component support frame 106, lower portion 102b of the containment vessel 102 and the lower solar panel 114 are omitted from the illustrations of FIGS. 8-12 to provide greater clarity as to the shape and structure of the upper portion 102a of the containment vessel 102. In FIG. 8, the upper portion 102a is implemented in a substantially hemispherical configuration. In this embodiment, the small hemispherical surface features 120 are replaced with a lenticular lens disposed on the interior surface on the upper portion 102a. The lenticular lens 120 functions in a manner similar to that of the hemispherical shaped surface features of FIGS. 4-6 to direct incoming light to the active surface of the upper solar panel 110.

Figure 9:
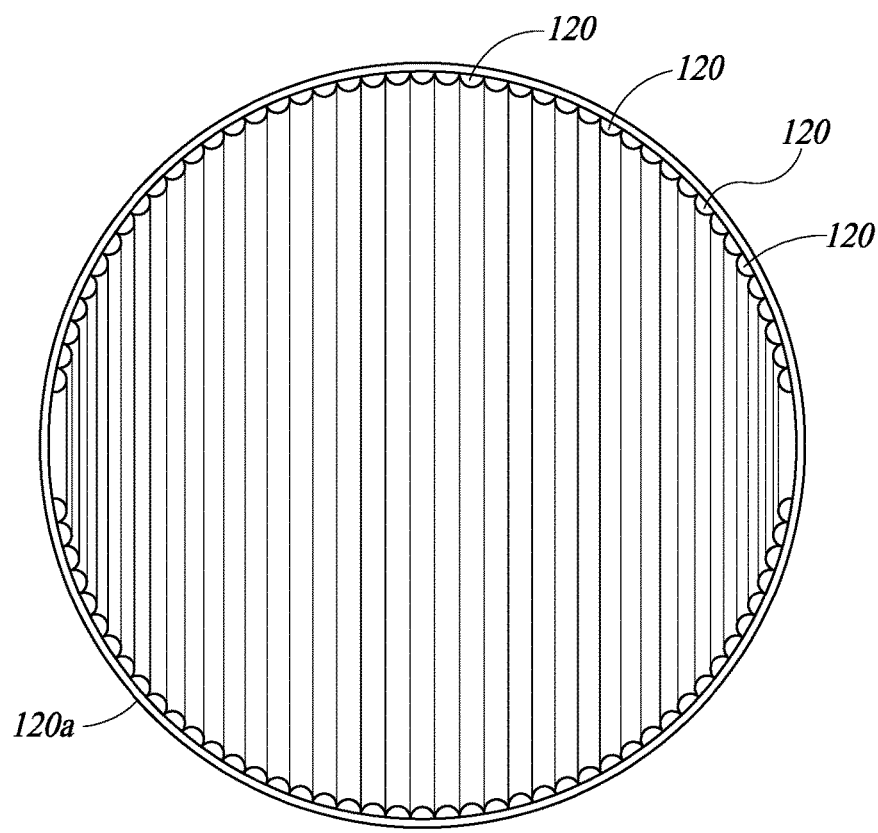
FIG. 9 is an interior view of the upper portion of the solar energy containment vessel with the lens arrangement of FIG. 8.

FIG. 9 is a view of the interior of the upper portion 102a of the containment vessel 102 illustrating the lenticular lens 120. The lenticular lens 120 helps direct incoming solar radiation to the active surface of the upper solar panel 110.

Figure 10:
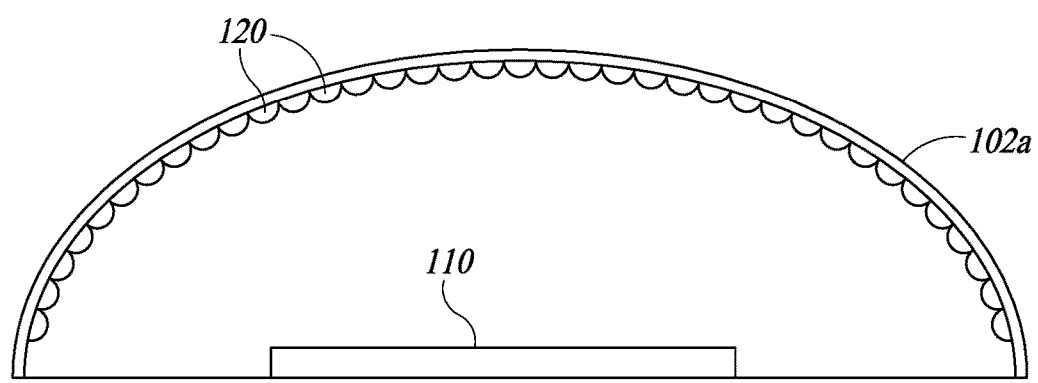
FIG. 10 illustrates a front elevational cutaway view of an upper portion of the containment vessel the lens implementation of FIG. 8, but with a different overall shape.

FIG. 10 illustrates the upper portion 102a of the containment vessel 102 implemented in the shape of a parabola. As with the embodiment of FIGS. 8-9, the surface features 120 are implemented in the form of a lenticular lens disposed on the interior surface of the upper portion 102a.

Figure 11:
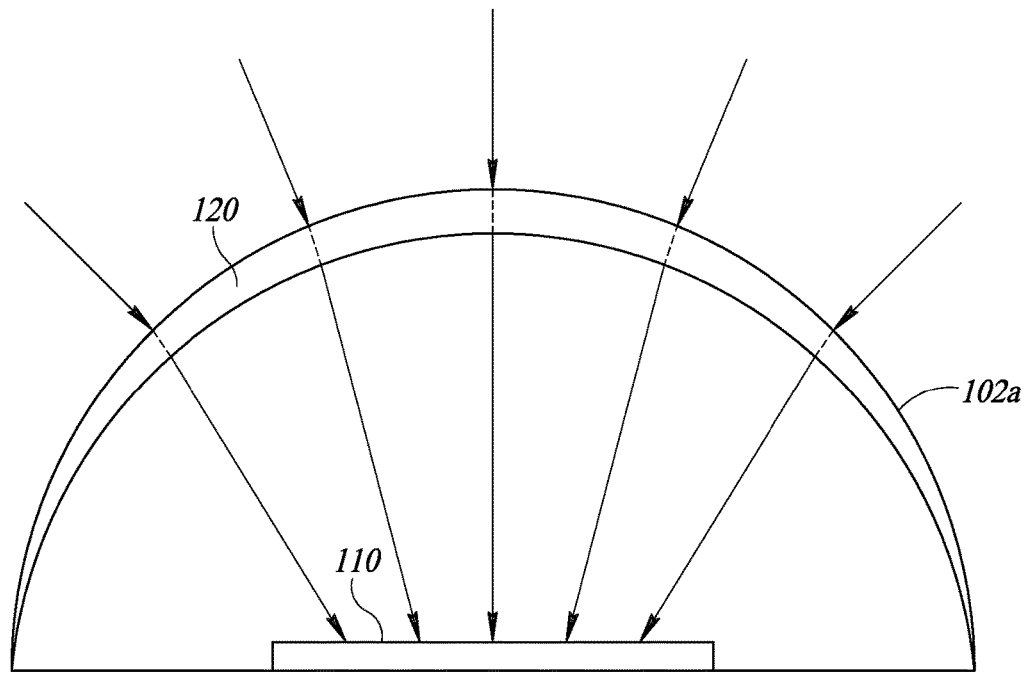
FIG. 11 illustrates a front elevational cutaway view of an upper portion of the containment vessel with an optical lens implementation.
Figure 12:
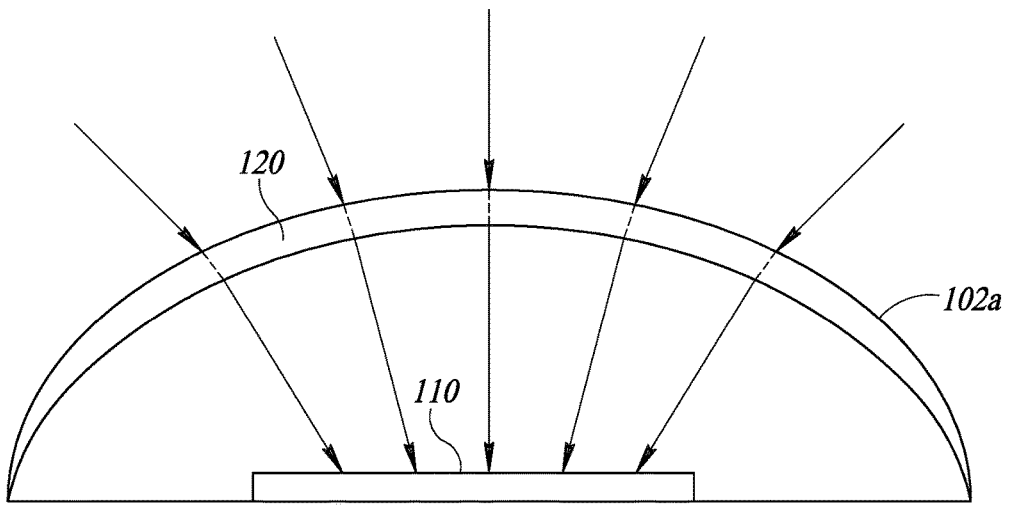
FIG. 12 illustrates the upper portion of the containment vessel with the optical lens arrangement of FIG. 11, but with a different overall shape.

In the embodiments of FIGS. 11 and 12, the surface features 120 are implemented in the form of a lens by altering the overall shape of the upper portion 102a of the containment vessel 102. In this embodiment, the upper portion 102a may be constructed of an optical grade material, such as optical-grade glass or plastic, that is machined to form the lens embodiment of the surface feature 120, and thus direct incoming light to the active surface of the upper solar panel 110. The upper portion 102a of the containment vessel 102 is implemented in a generally hemispherical shape in FIG. 11.

FIG. 12 illustrates a variation in the embodiment of FIG. 11 where the overall shape of the upper portion 102a of the containment vessel 102 is parabolic. As with the embodiment of FIG. 11, the surface features 120 are implemented as an optical lens designed to direct incoming solar radiation onto the active surface of the upper solar panel 110.

Those skilled in the art will appreciate that the surface features 120 can be implemented in other configurations as well. For example, the surface features 120 and the upper portion 102a of the containment vessel 102 can be implemented as a series of lenses to direct incoming radiation to the upper solar panel 110. For example, the surface features 120 could be implemented as a series of hemispherical features, such as illustrated in FIGS. 4-5, as a series of separate lenticular lenses, as illustrated in FIGS. 9-10, or as a series of optical lenses, as illustrated in FIGS. 11-12. The surface features 120 may also be implemented as a Fresnel lens, which is known in the art. The surface features 120 may be implemented as one or more Fresnel lenses. As those skilled in the art will appreciate, a variety of designs can be satisfactorily implemented for both the upper portion 102a and the lower portion 102b of the containment vessel 102. The overall goal of the upper portion 102a of the containment vessel 102 is to direct as much light as possible to the upper solar panel 110. Various lens configurations and designs can be used to increase the amount of light directed to the upper solar panel 110. Similarly, the design goal of the lower portion 102b of the containment vessel is to direct as much reflective light to the lower solar panel as possible. In this manner, the density of solar panels on a rooftop or other installation location is effectively doubled by including both upper and lower solar panels 110 and 114.

Figure 13:
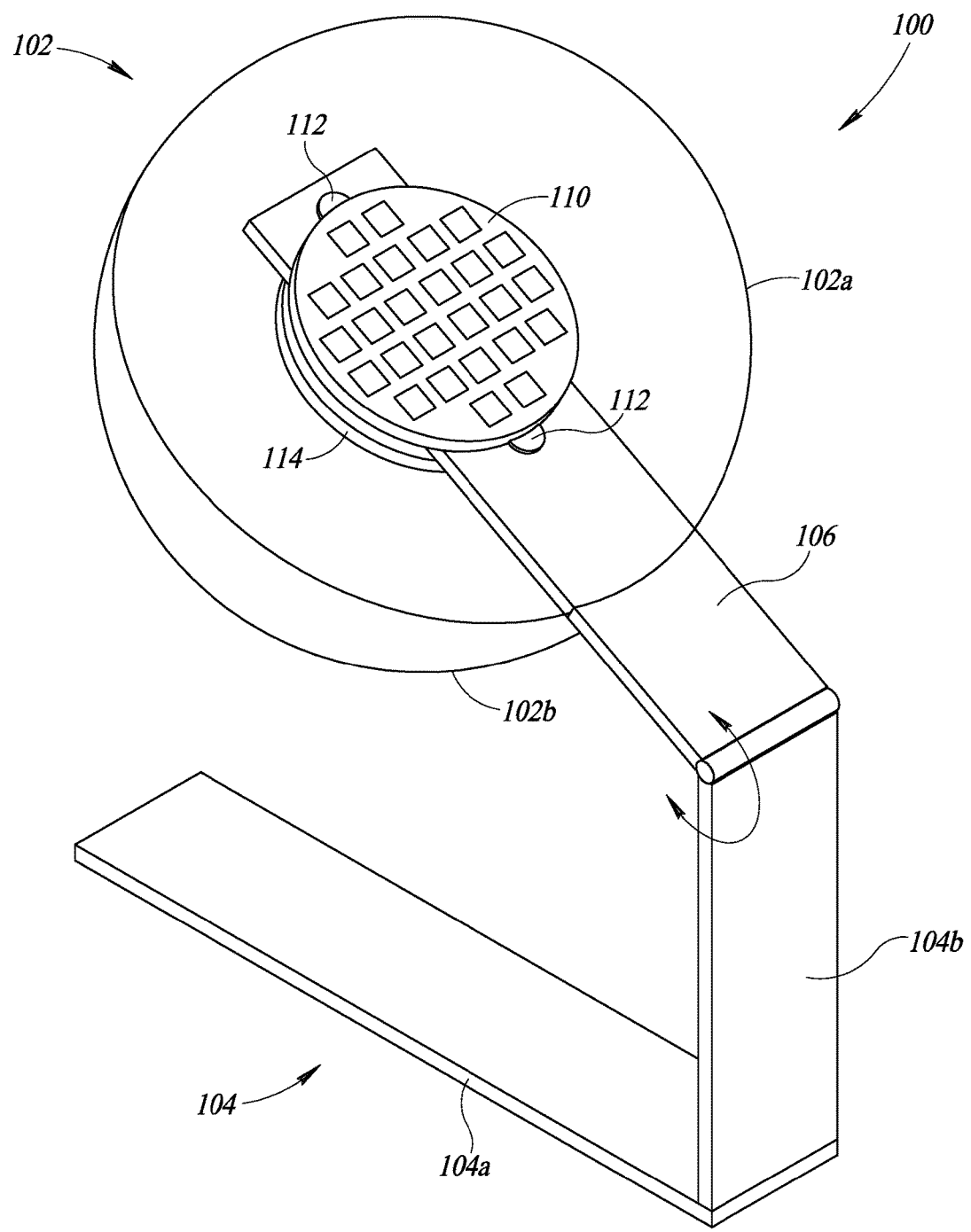
FIG. 13 illustrates an embodiment of the containment vessel in which the support structures permit the active surface of the solar panels to be angled for maximum solar efficiency.

FIG. 13 illustrates yet another alternative embodiment of the system 100. In this embodiment the component support frame 106 is rotatably mounted to the side support 104b of the support frame 104. This arrangement permits the system to be mounted on a surface, such as a roof, and then rotated to maximize the capture of solar radiation. Typically the containment vessel 102 is rotated and fixed at a desired angle to maximize the capture of solar radiation. For example, in one installation site, the system 100 may be mounted on a flat roof and the component support frame 106 rotated to a selected angle to more directly face the path of the sun across the sky. If the same system 100 is mounted on an angled roof, the component support frame 106 rotated to a different selected angle to more directly face the path of the sun across the sky.

Those skilled in the art will appreciate that additional variations are possible and yet remain within the scope of the claims. For example, different shapes have been described for the upper and lower portions 102a-102b of the containment vessel 102. The figures illustrate the upper and lower portions 102a-102b joined together at a seam to form an enclosed containment vessel 102. In this embodiment, an opening is formed at the seam between the upper and lower portions 102a-102b of the containment vessel 102 to permit the installation of the component support frame 106. This embodiment can provide structural integrity.

However, the upper and lower portions 102a-102b can also be spaced apart slightly from each other to form an opening extending circumferentially around the containment vessel 102 instead of a closed seam. Connector elements (not shown), such as a plurality of flat metal braces, are attached to the upper and lower portions 102a-102b of the containment vessel 102 around the periphery of the upper and lower portions to couple the portions together and provide structural integrity while also maintaining the spaced apart opening between the portions. In this embodiment, the component support frame 106 extends into the interior portion of the containment vessel 102 through the spaced apart opening between the upper and lower portions 102a-102b of the containment vessel. In this embodiment, the containment vessel 102 can use the upper aperture 126 (see FIG. 1) in conjunction with the spaced apart opening between the upper and lower portions 102a-102b of the containment vessel to provide cooling of the interior portion of the containment vessel 102. The lower aperture 128 can also be included for drainage, or for additional cooling.

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Accordingly, the invention is not limited except as by the appended claims.

The invention claimed is:

1. A solar energy system comprising:
   a sphere having upper and lower hemispheres, the upper hemisphere comprising a plurality of hemispherical protrusions disposed on an inner surface of the upper hemisphere, the lower hemisphere comprising a mirrored coating disposed on an inner surface of the lower hemisphere, the upper and lower hemispheres being joined at a midline region;
   a component support frame extending into an interior portion of the sphere proximate the midline region, the component support frame having upper and lower mounting surfaces;
   an upper solar panel comprising a first plurality of solar cells mounted to the upper mounting surface of the component support frame in the interior portion of the sphere and having an active surface directed toward the upper hemisphere; and
   a lower solar panel comprising a second plurality of solar cells mounted to the lower mounting surface of the component support frame in the interior portion of the sphere and having an active surface directed toward the lower hemisphere.

2. The system of claim 1 wherein the upper hemisphere is clear.

3. The system of claim 1 wherein the upper hemisphere is plastic.

4. The system of claim 1 wherein a first end of the component support frame is positioned in the interior portion of the sphere and a second end of the component support frame is positioned outside the sphere, the system further comprising a support leg coupled to the second end of the component support frame.

5. The system of claim 4 wherein the support leg is rotatably coupled to the component support frame to permit a rotatable adjustment of the component support frame.

6. The system of claim 1 wherein the component support frame is manufactured from metal to thereby provide a heat sink for the upper and lower solar panels.

7. The system of claim 1, further comprising an aperture in the upper hemisphere.

8. The system of claim 1, further comprising an aperture in the lower hemisphere.

9. The system of claim 1 wherein the component support frame is manufactured from an optically transparent material to thereby to permit light to pass through the component support frame.

10. The system of claim 1, further comprising a plurality of the spheres each of the plurality of spheres containing upper and lower solar panels, respectively, to form a solar energy system array.

11. A solar energy system comprising:
    a transparent upper hemisphere, the upper hemisphere comprising a plurality of hemispherical protrusions disposed on an inner surface thereof;
    a lower hemisphere configured to be connected to the upper hemisphere to thereby form a spherical containment vessel, the lower hemisphere comprising a mirrored coating disposed on an inner surface thereof;
    a component support frame extending into an interior portion of the containment vessel, the component support frame having upper and lower mounting surfaces;
    an upper solar panel comprising a first plurality of solar cells mounted to the upper mounting surface of the component support frame in the interior portion of the containment vessel and having an active surface directed toward the upper hemisphere; and
    a lower solar panel comprising a second plurality of solar cells mounted to the lower mounting surface of the component support frame in the interior portion of the containment vessel and having an active surface directed toward the lower hemisphere.

* * * * *